(12) United States Patent
Shioyama

(10) Patent No.: US 6,813,186 B2
(45) Date of Patent: Nov. 2, 2004

(54) NONVOLATILE SEMICONDUCTOR MEMORY DEVICE

(75) Inventor: Kazutomo Shioyama, Sakai (JP)

(73) Assignee: Sharp Kabushiki Kaisha, Abeno-ku (JP)

( * ) Notice: Subject to any disclaimer, the term of this patent is extended or adjusted under 35 U.S.C. 154(b) by 204 days.

(21) Appl. No.: 10/186,478

(22) Filed: Jun. 28, 2002

(65) Prior Publication Data

US 2003/0006432 A1 Jan. 9, 2003

(30) Foreign Application Priority Data

Jun. 29, 2001 (JP) ........................................ 2001-199873

(51) Int. Cl.[7] .............................................. G11C 16/04
(52) U.S. Cl. ............................ 365/185.12; 365/185.05; 365/185.06; 365/185.07; 365/185.08; 365/185.13; 365/185.21
(58) Field of Search ....................... 365/185.01–185.13, 365/185.21–185.25, 185.18, 185.28

(56) References Cited

U.S. PATENT DOCUMENTS

| 5,615,149 | A | 3/1997 | Kobayashi et al. |
| 5,999,479 | A | 12/1999 | Park et al. |
| 6,222,773 | B1 | 4/2001 | Tanzawa et al. |
| 2001/0000692 | A1 | 5/2001 | Guliani et al. |

FOREIGN PATENT DOCUMENTS

| EP | 0525678 | 2/1993 |
| EP | 0 798 742 | 10/1997 |
| EP | 1 058 271 | 12/2000 |
| EP | 1176508 | 1/2002 |
| EP | 1 176 608 | 1/2002 |
| TW | 0396341 | 7/2000 |

OTHER PUBLICATIONS

Communication from the European Patent Office mailed on Aug. 22, 2003, for patent application No. EP 02 254 586. 6 pages total.
Atsumi, S. et al. (Feb., 1996) "A 3.3 V–only 16 Mb Flash Memory with Row–Decoding Scheme," *Digest of Technical Papers. 1996 IEEE International Solid–State Circuits Conference: 42–43, 415.*
Tanaka, T. et al (1994) "High–Speed Programming and Program–Verify Methods Suitable for Low–Voltage Flash Memories," *Digest of Technical Papers. 1994 Symposium on VLSI Circuits: 61–62.*

*Primary Examiner*—Donghee Kang
(74) *Attorney, Agent, or Firm*—Morrison & Foerster LLP

(57) ABSTRACT

A nonvolatile semiconductor memory device of the present invention includes: a plurality of memory blocks each including a memory array including a plurality of memory cells, a plurality of word lines and bit lines provided so as to cross each other for selecting the memory cell, a row decoder for selecting the word line according to an externally-input row address signal, a column decoder for selecting the bit line according to an externally-input column address signal; and at least one internal voltage generation circuit for applying a voltage required for performing data write/erase operations on the memory array, a plurality of first switch circuits are provided such that each first switch circuit is provided between the at least one internal voltage generation circuit and the row decoder or the column decoder, and a switch selection circuit is provided for selectively operating the plurality of first switch circuits.

7 Claims, 3 Drawing Sheets

NONVOLATILE SEMICONDUCTOR MEMORY DEVICE

BACKGROUND OF THE INVENTION

1. Field of the Invention

The present invention relates to a nonvolatile semiconductor memory device, and more particularly to a nonvolatile semiconductor memory device which includes an internal voltage generation circuit having a function of generating a high voltage required for data write/erase operations and can reduce an area occupied by the internal voltage generation circuit or suppress an increase in such an area by reducing load applied to an output terminal of the internal voltage generation circuit from which a high voltage is provided.

2. Description of the Related Art

Recently, a nonvolatile semiconductor memory device represented by a flash memory is coming into wide use. The nonvolatile semiconductor memory device has a feature that electric power is not required for holding stored information, and therefore is mainly used in a mobile apparatus, such as a mobile phone or a mobile information processing apparatus, which is severely required to be compact in size and consume low power.

In general, a flash memory often has functions of electrically writing and erasing data and includes an internal voltage generation circuit (hereinafter, referred to as "charge pump circuit) having a function of generating a high voltage required for data write/erase operations.

Such a conventional flash memory is described below with reference to FIG. 2. As shown in FIG. 2, the conventional flash memory includes a plurality of memory blocks B1 and B2 (the memory block B2 has a same structure as that of the memory block B1 and is therefore not shown in detail) each including: a memory array M1 including a plurality of memory cells; a plurality of word lines WL and bit lines BL provided so as to cross each other for selecting a memory cell (in this case, the word lines WL and bit lines BL are perpendicular to each other); a row decoder XD for selecting a word line WL according to an externally-input row address signal; and a column decoder YD for selecting a bit line BL according to an externally-input column address signal. Each of the memory blocks B1 and B2 is connected to charge pump circuits PV1 and PV2 so as to provide the voltage required for performing data write/erase operations on the memory arrays M1. A voltage generated by the charge pump circuit PV1 is applied to the row decoder XD in each of the plurality of memory blocks B1 and B2. A voltage generated by the charge pump circuit PV2 is applied to the column decoder YD in each of the plurality of memory blocks B1 and B2. Although a case where the plurality of memory blocks are two memory blocks B1 and B2 is described below, the plurality of memory blocks are not limited to two memory blocks and three or more memory blocks can be used as the plurality of memory blocks.

Next, a voltage to be applied for data write/erase operations is described with reference to a structure of a flash memory shown in FIG. 3. In FIG. 3, reference numerals 1 and 2 denote diffusion regions which respectively form a drain region (D) and a source region (S) of a memory cell. Reference numeral 4 denotes a floating gate (FG) for holding electric charge which is in a state of being fully insulated from electricity by oxide films 3 and 5. Reference numeral 6 denotes a control gate (CG) formed on the oxide film 5. Injection of electric charge into the floating gate 4 (data write) and drawing of electric charge from the floating gate 4 (data erase) are performed by applying a voltage to the control gate 6.

In general, injection and drawing of electric charge (electrons) are performed by means of a tunnel current or activated hot electrons passing through the oxide film 3, and therefore the oxide film 3 is also called a tunnel film. Electric charge injected into the floating gate 4 through the oxide film 3 is semipermanently held in the floating gate 4 if a specific electric field is not applied. Therefore, the flash memory functions as a nonvolatile semiconductor memory device.

Examples of specific values of applied voltage are described below. In the case of a data write operation by means of the injection of hot electrons, for example, a high voltage of 12V is applied to the control gate 6, a high voltage of 6V is applied to the drain region 1, and zero voltage is applied to the source region 2. This allows a channel to be formed between the source and drain regions 2 and 1, so that a large current flows through the channel (electron migration from the source region 2 to the drain region 1). After the migration from the source region 2 to the drain region 1, each electron has a large energy due to the high voltage applied to the drain region 1. When an electron has higher energy than that of an energy barrier of an insulation film (oxide film 3), the electron can migrate to the floating gate 4. According to this mechanism, the injection of the electrons into the floating gate 4 brings a memory cell into a data write state.

On the other hand, in the case of a negative voltage erase method which is one of the methods for drawing electrons stored in a floating gate into a source of a memory cell, for example, a voltage of −10V is applied to the control gate 6, zero voltage is applied to the source region 2, and the drain region 1 is brought into a floating (high impedance) state. This allows electrons to migrate from the floating gate 4 to the source region 2 due to a tunnel effect, thereby erasing data in the memory cell.

As described above, in order to perform data write/erase operations on a flash memory cell, either of positive or negative voltages, which is higher than a normal power supply voltage, is required. Such a high voltage or a negative voltage is applied to a drain of the flash memory cell via a bit line connected thereto and a control gate of the flash memory cell via a word line connected thereto.

When performing a data write operation, the charge pump circuit PV1 generates, for example, a voltage of 12V which is applied to a predetermined word line via a row decoder XD in a selected memory block and the charge pump PV2 generates, for example, a voltage of 6V which is applied to a predetermined bit line via a column decoder YD in the selected memory block. As a result of this, data is written in a memory cell in which the predetermined word and bit lines cross each other. In an unselected memory block, no voltage is applied to any one of word and bit lines by the charge pump circuits PV1 and PV2.

However, in the conventional structure described above, the charge pump circuits PV1 and PV2 are respectively connected to the row decoders XD and the column decoders YD of all the memory blocks, and therefore a large load is applied to each of the charge pump circuits PV1 and PV2.

Accordingly, when a current application ability of a charge pump circuit is weak, a voltage applied by that charge pump circuit to a memory array is reduced, so that a data write property of the charge pump circuit with respect to the memory array is deteriorated, thereby causing problems, e.g., a period of time required for a data write operation is lengthened. Further, similar problems are caused with respect to a data erase operation on the memory array.

Therefore, in the conventional nonvolatile semiconductor memory device, as memory capacity is increased, a size of a charge pump circuit is also required to be increased, thereby further increasing an area of a semiconductor chip.

SUMMARY OF THE INVENTION

According to one aspect of the present invention, there is provided a nonvolatile semiconductor memory device including: a plurality of memory blocks each including a memory array including a plurality of memory cells, a plurality of word lines and bit lines provided so as to cross each other for selecting the memory cell, a row decoder for selecting the word line according to an externally-input row address signal, a column decoder for selecting the bit line according to an externally-input column address signal; and at least one internal voltage generation circuit for applying a voltage required for performing data write/erase operations on the memory array, a plurality of first switch circuits are provided such that each first switch circuit is provided between the at least one internal voltage generation circuit and the row decoder or the column decoder, and a switch selection circuit is provided for selectively operating the plurality of first switch circuits.

In one embodiment of the invention, the at least one internal voltage generation circuit includes a charge pump circuit and has a function of generating a voltage which is higher than a positive or negative power supply voltage.

In another embodiment of the invention, each first switch circuit has a function of electrically connecting and disconnecting the at least one internal voltage generation circuit to the memory block so as to selectively apply an output voltage provided by the internal voltage generation circuit to the memory block.

In still another embodiment of the invention, the switch selection circuit has a function of outputting a signal for selecting at least one of the plurality of first switch circuits according to an externally-input address signal.

In still another embodiment of the invention, each first switch circuit is formed of a P-channel-type MOS transistor.

In still another embodiment of the invention, a plurality of second switch circuits are provided such that one of a source and a drain of each second switch circuit is connected to an output terminal of a corresponding one of the plurality of first switch circuits provided between the at least one internal voltage generation circuit and the row decoder or the column decoder and the other one of the source and the drain thereof is grounded, and each second switch circuit has a function of grounding a connection point between the row or column decoder and the corresponding one of plurality of first switch circuits when the corresponding one of plurality of first switch circuits is electrically disconnected.

In still another embodiment of the invention, each second switch circuit is formed of an N-channel-type MOS transistor.

Functions of the present invention are described below.

In the present invention, a first switch circuit provided between an internal voltage generation circuit (a charge pump circuit) and a row or column decoder is selectively operated using a switch selection circuit. By connecting the charge pump circuit only to a memory block selected from a plurality of memory blocks so as to apply an output voltage from the charge pump circuit to the selected memory block, it is possible to reduce the load applied to the charge pump circuit.

In order to conduct a high voltage generated by the charge pump circuit without reducing potential of the high voltage, it is preferable to use a P-channel-type MOS transistor as the first switch circuit.

Further, by providing a plurality of second switch circuits such that one of a source and a drain of each second switch circuit is connected to an output terminal of the first switch circuit and the other one of the source and the drain thereof is grounded and grounding the row or column decoder when the first switch circuit is electrically disconnected, it is possible to reduce the load applied to the charge pump circuit connected to the row or column decoder.

Since an N-channel-type MOS transistor is superior in conductive properties to a P-channel-type MOS transistor, it is preferable to use the N-channel-type MOS transistor as the second switch circuit which is a transistor having ground potential as source potential.

Thus, the invention described herein makes possible the advantages of providing a nonvolatile semiconductor memory device which can reduce the load applied to an internal voltage generation circuit without deteriorating data write/erase properties, so that a size of the internal voltage generation circuit is kept minimum, thereby preventing an increase in area of a semiconductor chip.

These and other advantages of the present invention will become apparent to those skilled in the art upon reading and understanding the following detailed description with reference to the accompanying figures.

DESCRIPTION OF THE PREFERRED EMBODIMENTS

Hereinafter, embodiments of the present invention will be described with reference to the accompanying figures.

Figure 1:
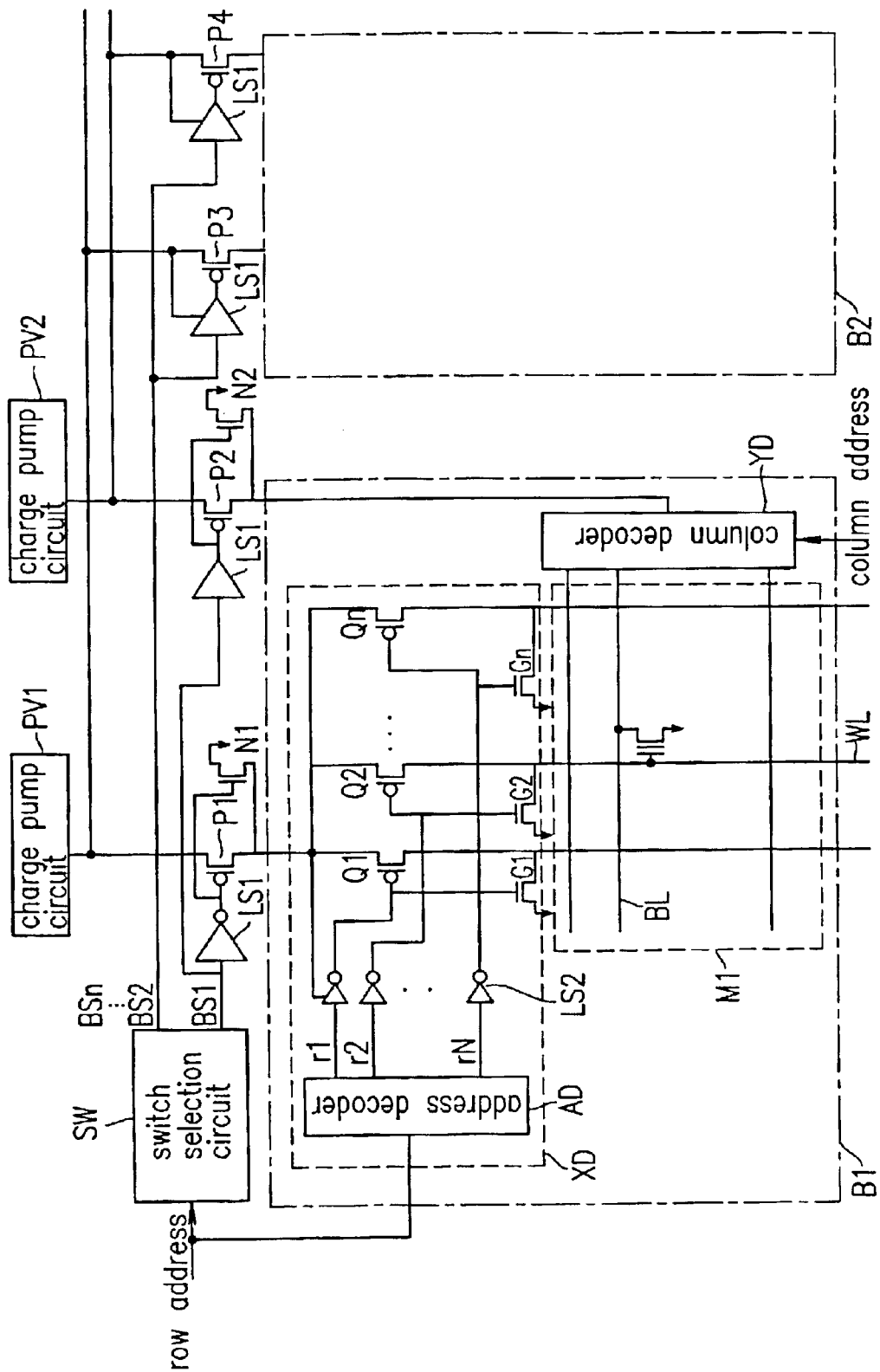
FIG. 1 is a block diagram illustrating a structure of a nonvolatile semiconductor memory device according to an embodiment of the present invention.
Figure 2:
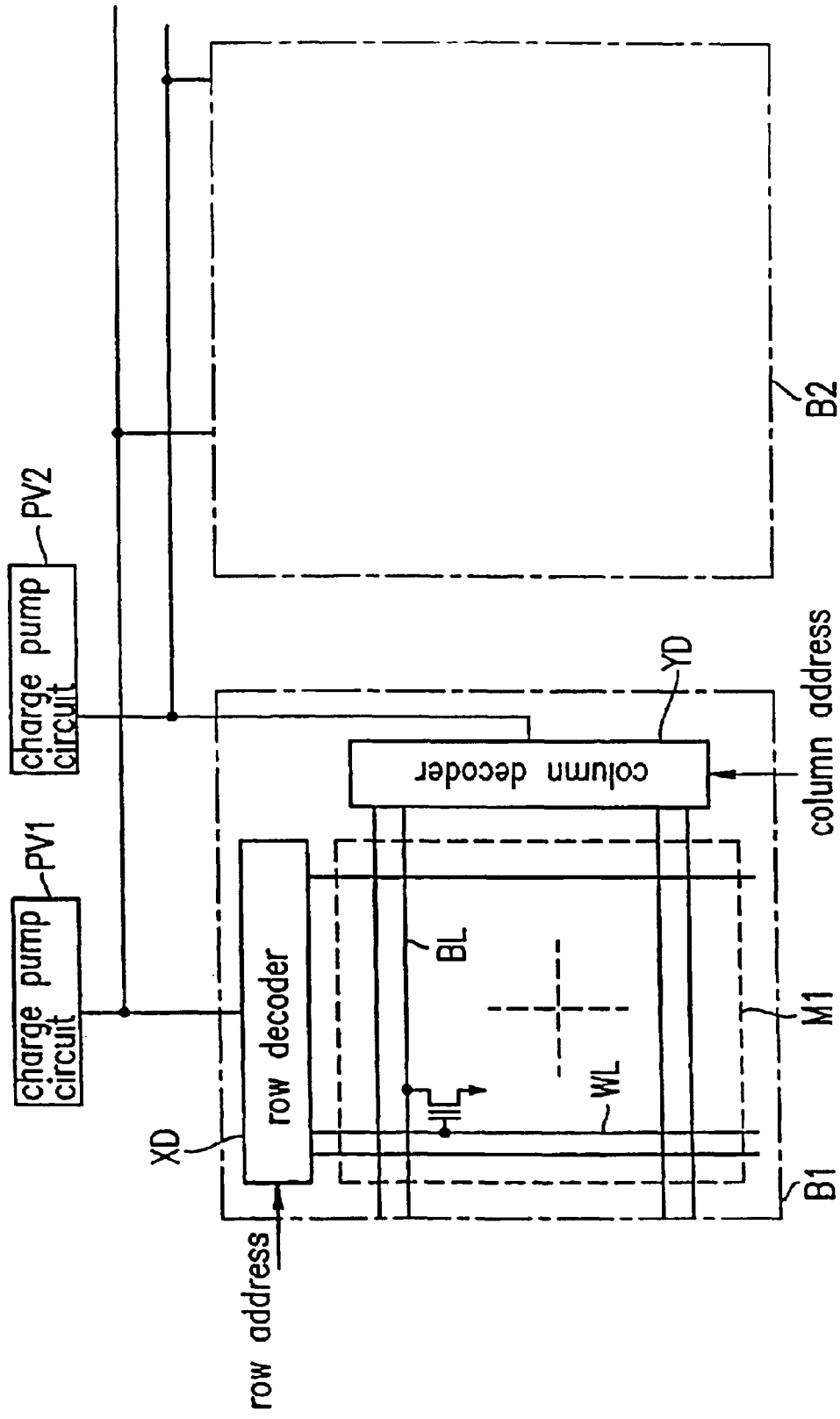
FIG. 2 is a block diagram illustrating a structure of a conventional nonvolatile memory device.
Figure 3:
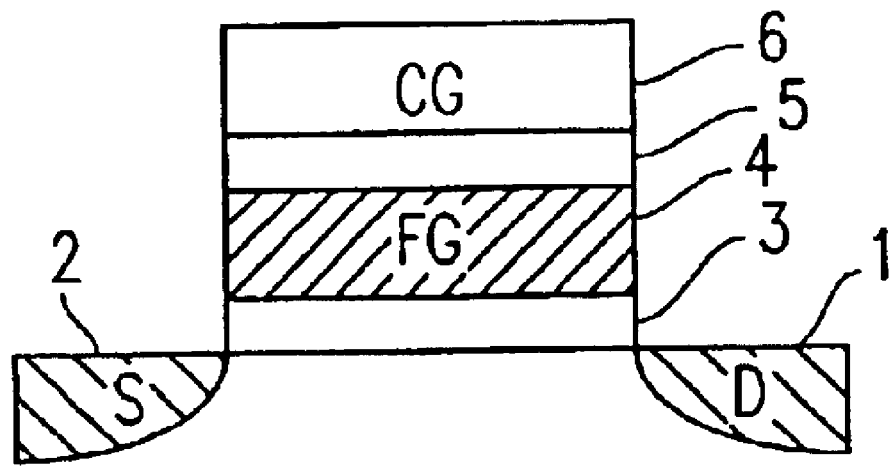
FIG. 3 is a cross-sectional view illustrating a structure of a typical flash memory cell.

FIG. 1 is a block diagram illustrating a structure of a flash memory which is an embodiment of a nonvolatile semiconductor memory device of the present invention. As shown in FIG. 1, this flash memory includes a plurality of memory blocks B1 and B2 (the memory block B2 has a same structure as that of the memory block B1 and is therefore not shown in detail) each including: a memory array M1 including a plurality of memory cells; a plurality of word lines WL and bit lines BL provided so as to cross each other for selecting a memory cell (in this case, the word lines WL and bit lines BL are perpendicular to each other); a row decoder XD for selecting a word line WL according to an externally-input row address signal; and a column decoder YD for selecting a bit line BL according to an externally-input column address signal. In the memory block B1, the row decoder XD is connected to a switch circuit P1 and the column decoder YD is connected to a switch circuit P2. In the memory block B2, the row decoder XD is connected to a switch circuit P3 and the column decoder YD is connected to a switch circuit P4. The switch circuits P1 and P3 are connected to a charge pump circuit PV1 for providing a voltage required for performing data write/erase operations on memory arrays M1. The switch circuits P2 and P4 are connected to a charge pump circuit PV2. A voltage generated by each of the charge pump circuits PV1 and PV2 is higher than a power supply voltage for driving the memory arrays M1. A voltage generated by the charge pump circuit PV1 is applied to the row decoder XD in the memory block B1 via the switch circuit P1 and to the row decoder XD in the memory block B2 via the switch circuit P3. A voltage generated by the charge pump circuit PV2 is applied to the column decoder YD in the memory block B1 via the switch circuit P2 and to the column decoder YD in the memory block B2 via the switch circuit P4. Although a case where the plurality of memory blocks are two memory blocks B1 and B2 is described below, the plurality of memory blocks are not limited to two memory blocks and three or more memory blocks can be used as the plurality of memory blocks.

In this embodiment of the present invention, in order to conduct a high voltage generated by each of the charge pump circuits PV1 and PV2 so as not to reduce a potential level, p-channel-type MOS transistors are used as the switch circuits P1–P4.

The switch circuits P1–P4 are connected to a switch selection circuit SW for selectively activating the switch circuits P1–P4. The switch selection circuit SW receives an externally-input row address signal and outputs block selection signals BS1 and BS2 so as to selectively apply output voltages of the charge pump circuits PV1 and PV2 to the memory blocks B1 and B2. It should be noted that the number of block selection signals to be output corresponds to the number of memory blocks, e.g., when there are M memory blocks in a flash memory, M block selection signals are output.

In this embodiment of the present invention, for clarity of description, an address signal which is externally input to the switch selection circuit SW is described as being a row address signal. However, such an address signal is not limited to the row address signal and can be a column address signal or a combination of the row and column address signals.

The block selection signal BS1 from the switch selection circuit SW is input to each gate of the switch circuits P1 and P2 with a level of the block selection signal BS1 being shifted by a level shifter LS1. The block selection signal BS2 from the switch selection circuit SW is input to each gate of the switch circuits P3 and P4 with a level of the block selection signal BS2 being shifted by the level shifter LS1. In this case, an inversion level shifter, which shifts a level of a signal based on a stable ground potential, is used as the level shifter LS1 so as to ensure that the switch circuits P1–P4, which are the P-channel-type MOS transistors, are turned on.

A switch circuit N1 is provided such that a gate thereof is connected between connection points of the switch circuit P1 and the level shifter LS1. The switch circuit N1 has a source connected to ground and a drain connected to a drain of the switch circuit P1. When the switch circuit P1 is electrically disconnected, the switch circuit N1 is brought into a conductive state so as to ground the row decoder XD. Further, a switch circuit N2 is provided such that a gate thereof is connected between connection points of the switch circuit P2 and the level shifter LS1. The switch circuit N2 has a source connected to ground and a drain connected to a drain of the switch circuit P2. When the switch circuit P2 is electrically disconnected, the switch circuit N2 is brought into a conductive state so as to ground the column decoder YD.

Next, a specific circuit structure of the row decoder XD is described. The row decoder in the memory block B1 has a same structure as that of the row decoder in the memory block B2, and therefore only the row decoder in the memory block B1 is described below.

The row decoder XD includes the P-channel-type MOS transistors Q1, Q2, ..., Qn, an address decoder AD, and a plurality of level shifters LS2 the number of which corresponds to the number of P-channel-type MOS transistors Q. N-channel-type MOS transistors G1, G2, ..., Gn are provided such that each N-channel-type transistor is connected between a single level shifter LS2 and a single P-channel-type MOS transistor Q. It should be noted that n denotes the number of columns, i.e., the number of word lines, in a single memory block.

All the sources of the P-channel-type MOS transistors Q1–Qn are connected to an output terminal of the switch circuit P1 and each drain of the P-channel-type MOS transistors Q1–Qn is connected to a corresponding one of the word lines WL. Each of signals r1, r2, ..., rn which are obtained by decoding externally input row address signals using the address decoder AD are input to a corresponding one of gates of the P-channel-type MOS transistors Q1, Q2, ..., Qn with a level of each of the signals r1–rn being shifted by a level shifter LS2. Similar to the level shifter LS1, an inverse level shifter is used as the level shifter LS2.

The N-channel-type MOS transistors G1–Gn are provided so as to ground unselected word lines. The reason for this is that when the same potential as that of selected memory cell is applied to unselected memory cells, gate disturbance is caused, thereby decreasing the reliability of data. Further, the reason why the N-channel-type MOS transistor are used is that they are superior in ability to pass a ground potential therethrough.

Next, data write/erase operations on the memory block B1 are described. When performing the data write operation, a row address signal is externally input to the switch selection circuit SW so that the block selection signal BS1 output by the switch selection circuit SW is activated. The block selection signal BS1 is input to the switch circuits P1 and P2 via their respective level shifters LS1 so as to bring the switch circuits P1 and P2 into a conductive state. As a result of this, the charge pump circuits PV1 and PV2 apply a voltage to the row decoder XD and the column decoder YD, respectively.

For example, the charge pump circuit PV1 generates a voltage of 12V which is applied to a predetermined word line via the switch circuit P1 and the row decoder XD of the memory block B1 and the charge pump circuit PV2 generates a voltage of 6V which is applied to a predetermined bit line via the switch circuit P2 and the column decoder YD of the memory block B1. As a result, data is written in a memory cell in which the predetermined word line and the predetermined bit line cross each other.

In this case, in the unselected memory block B2, a block selection signal BS2 output by the switch selection circuit SW is not activated, so that the switch circuits P3 and P4 are in a nonconductive state. Therefore, no voltage is applied to any one of the word lines and bit lines in the memory block B2 by the charge pump circuits PV1 and PV2.

When performing a data erase operation, a row address signal is externally input to the switch selection circuit SW so that the block selection signal BS1 output by the switch selection circuit SW is activated. The block selection signal BS1 is input to the switch circuits P1 and P2 via their respective level shifters LS1 so as to bring the switch circuits P1 and P2 into a conductive state. As a result of this, the charge pump circuits PV1 and PV2 apply a voltage to the row decoder XD and the column decoder YD, respectively.

For example, a voltage of −12V generated and applied to the switch circuit P1 by the charge pump circuit PV1 is output from the switch circuit P1 since the block selection signal BS1 is input to the gate of the switch circuit P1 via the level shifter LS1 so as to turn on the switch circuit P1. Similarly, the voltage applied to the P-channel-type MOS transistors Q1–Qn by the switch circuit P1 is output from the P-channel-type MOS transistors Q1–Qn since the address signals r1–rn are input to corresponding gates of the P-channel-type MOS transistors Q1–Qn via the irrespective level shifters LS2 so as to turn on the P-channel-type MOS transistors Q1–Qn. Specifically, a threshold voltage of the P-channel-type MOS transistor forming the switch circuit P1 and a threshold voltage of a corresponding one of the P-channel-type MOS transistors Q1–Qn included in the row decoder XD are added to the voltage of −12V which is generated by the charge pump circuit PV1, so that a voltage of about −10V required for the data erase operation is applied to each word line WL in the selected memory block B1. The charge pump circuit PV2 does not generate such a high voltage as is generated by the charge pump circuit PV1, and therefore, although the block selection signal BS1 brings the switch circuit P2 of the memory block B1 into a conductive state, a column address signal is inactive during the data erase operation, and therefore all the bit lines are controlled so as to be brought into a floating state. As a result, data in all the memory cells in the memory block B1 is erased.

In this case, in the unselected memory block B2, the block selection signal BS2 output by the switch selection circuit SW is not activated and an output voltage from the level shifter LS1 becomes 0V, so that the switch circuits P3 and P4 are brought into a nonconductive state. Therefore, no voltage is applied to any one of the word lines in the memory block B2 by the charge pump circuits PV1 and PV2.

During the data write/erase operations, in the unselected memory block B2, all the signals output from the address decoder AD are brought to a LOW level and are input to their respective N-channel-type MOS transistors G1–Gn via a corresponding one of the inverse level shifters LS2 so that that the N-channel-type MOS transistors G1–Gn are brought into a conductive state and all the word lines are grounded.

In this case, since an output voltage of the charge pump circuit PV1 is not applied to the unselected memory block B2 when performing the data write operation on the selected memory block B1, a level of an output from each inverse level shifter LS2 in the unselected memory block B2 is the same as that of a voltage applied by the charge pump circuit PV2 or a power supply Vcc (not shown). When performing the data erase operation on the selected memory block B1, an output voltage from each inverse level shifter LS2 in the unselected memory block B2 is a positive voltage (e.g., about 2V to 3V) which can bring the N-channel-type MOS transistors G1–Gn into a conductive state.

Further, in the unselected memory block B2, the switch circuits N1 and N2 are brought into a conductive state and therefore the row decoder XD and the column decoder YD are grounded, thereby reducing the load applied to the charge pump circuit PV2.

In this state, capacitance of the load applied to the charge pump circuit PV1 is a sum of parasitic capacitance of the drains of the switch circuits P1 and P3, parasitic capacitance of the drains of the P-channel-type MOS transistors Q1, Q2, . . . , Qn in the memory block B1 which are electrically connected to the charge pump circuit PV1 due to conduction of the switch circuit P1, and capacitance of the load applied to a word line which is selected due to conduction of any one of the P-channel-type MOS transistors Q1–Qn. In this case, the switch circuit P3 is in a nonconductive state, and therefore parasitic capacitance of the P-channel-type MOS transistors Q1–Qn in the memory block B2 and capacitance of the load applied to the word lines WL connected to the P-channel-type MOS transistors Q1–Qn in the memory block B2 are not included in the capacitance of the load applied to the charge pump circuit PV1.

For example, when a channel length L1 and a channel width W1 of each of the P-channel-type MOS transistors forming the switch circuits P1 and P2 are 1 μm and 180 μm, respectively, the parasitic capacitance of each of the switch circuits P1 and P2 is typically designed so as to be, for example, about 160 fF. When a channel length L2 and a channel width W2 of each of the P-channel-type MOS transistors Q1–Qn in the memory block B1 are 1 μm and 40 μm, respectively, the parasitic capacitance of each of the P-channel-type MOS transistors Q1–Qn is typically designed so as to be, for example, about 40 fF. When capacitance of the load applied to a single word line to be selected is 1.5 pF and the number (n) of rows in one memory block is n=2048, the entire capacitance of the load applied to the charge pump circuit PV1 is obtained as follows: 160 fF×2 (blocks)+40 fF×2048+1.5 pF=about 83.74 pF.

On the contrary, in the case where the flash memory shown in FIG. 1 does not include the switch circuits P1 and P3 as in the case of the conventional flash memory, although capacitance of load applied to the switch circuits P1 and P3 is excluded, load applied to the P-channel-type MOS transistors Q1–Qn in the memory block B2 are included in the entire capacitance of load applied to the charge pump circuit PV1, and therefore the entire capacitance of load applied to the charge pump circuit PV1 is obtained as follows: 40 fF×2048×2 (blocks)+1.5 pF=about 165.34 pF.

Therefore, according to this embodiment, capacitance of the load applied to the charge pump circuit PV1 is reduced by half as compared to the conventional flash memory. Further, based on the same solution, it is appreciated that as the number (M) of memory blocks connected to the charge pump circuit PV1 is increased, capacitance of the load applied to the charge pump circuit PV1 is reduced to 1/M as compared to the conventional flash memory.

Further, in this embodiment, similar to the entire capacitance of the load applied to the charge pump circuit PV1, entire capacitance of the load applied to the charge pump circuit PV2 includes capacitance of the load applied to the switch circuits P2 and P4, capacitance of the load applied to the column decoder YD in the memory block B1 which is connected to the charge pump circuit PV2 due to conduction of the switch circuit P2, and capacitance of the load applied to a bit line selected by the column decoder YD. In this case, the switch circuit P4 is in a nonconductive state, and therefore capacitance of the load applied to the column decoder YD in the memory block B2 and capacitance of the load applied to each bit line connected to the column decoder YD are not included in the entire capacitance of the load applied to the charge pump circuit PV2.

On the contrary, in the case where the flash memory shown in FIG. 1 does not include the switch circuits P2 and P4 as in the case of the conventional flash memory, although capacitance of the load applied to the switch circuits P2 and P4 is excluded, the load applied to the column decoder YD in the memory block B2 is included in the entire capacity of the load applied to the charge pump circuit PV2. In this case, capacitance of the load applied to the column decoder YD is overwhelmingly larger than that of the load applied to the switch circuits P2 and P4, so that the entire capacitance of the load applied to the charge pump circuit PV2 is reduced to about 1/M as compared to the conventional flash memory.

As described above, according to this embodiment, by connecting output terminals of charge pump circuits only to corresponding decoders selected as minimum requirements in a memory block, rather than to the memory block, it is possible to significantly reduce the load applied to the output terminals of the charge pump circuits. In this case, although all the switch circuits are connected to each of the charge pump circuits, the load applied to the switch circuits is considerably smaller than that applied to the decoders. Therefore, as compared to the conventional flash memory, the load applied to each of the charge pump circuits can be sharply decreased and when the number of memory blocks connected to each of the charge pump circuits is M, the load applied to each of the charge pump circuits is reduced to about 1/M.

A size of the charge pump circuit greatly depends on an entire area of a capacitor included in the charge pump circuit. The entire area of the capacitor is roughly proportional to the capacitance of the load to be driven, and therefore when the capacitance of the load is reduced to about 1/M, the size of the charge pump circuit can also be reduced to about 1/M.

As described in detail above, according to the present invention, it is possible to select decoders in a memory block as minimum requirements from all the memory blocks so as to provide an output of a corresponding one of the charge pump circuits, and therefore it is enough for each of the charge pump circuits to drive only a minimum number of loads required.

Although a size of a charge pump circuit used in a conventional memory and required for performing data read/write/erase operations on the conventional memory keeps on increasing while storage capacity of memories is increased day by day, according to the present invention, when a memory is divided into M memory blocks, it is possible to reduce an area in a semiconductor chip which is occupied by the charge pump circuit to about 1/M as compared to a conventional memory. Further, even if storage capacity of a memory is increased, by increasing the number of blocks in the memory so as to fix the storage capacity for one block, it is possible to suppress an increase of the size of the charge pump circuit.

Furthermore, by providing the charge pump circuits so as to be uniform in size, the driven load is reduced, and therefore it is possible to shorten a period of time required for prescribed potential to be reached, thereby shortening a period of time required for performing data write/erase operations.

This improves operating efficiency of the charge pump circuit, and therefore power consumption can be reduced and furthermore, it is possible to reduce production cost due to an effect of reducing a chip area.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nonvolatile semiconductor memory device comprising:

a plurality of memory blocks each including a memory array including a plurality of memory cells, a plurality of word lines and bit lines provided so as to cross each other for selecting the memory cell, a row decoder for selecting the word line according to an externally-input row address signal, a column decoder for selecting the bit line according to an externally-input column address signal; and at least one internal voltage generation circuit for applying a voltage required for performing data write/erase operations on the memory array, wherein a plurality of first switch circuits are provided such that each first switch circuit is provided between the at least one internal voltage generation circuit and the row decoder or the column decoder, and a switch selection circuit is provided for selectively operating the plurality of first switch circuits.

2. A nonvolatile semiconductor memory circuit according to claim 1, wherein the at least one internal voltage generation circuit includes a charge pump circuit and has a function of generating a voltage which is higher than a positive or negative power supply voltage.

3. A nonvolatile semiconductor memory circuit according to claim 1, wherein each first switch circuit has a function of electrically connecting and disconnecting the at least one internal voltage generation circuit to the memory block so as to selectively apply an output voltage provided by the internal voltage generation circuit to the memory block.

4. A nonvolatile semiconductor memory circuit according to claim 1, wherein the switch selection circuit has a function of outputting a signal for selecting at least one of the plurality of first switch circuits according to an externally-input address signal.

5. A nonvolatile semiconductor memory circuit according to claim 1, wherein each first switch circuit is formed of a P-channel-type MOS transistor.

6. A nonvolatile semiconductor memory circuit according to claim 1, wherein a plurality of second switch circuits are provided such that one of a source and a drain of each second switch circuit is connected to an output terminal of a corresponding one of the plurality of first switch circuits provided between the at least one internal voltage generation circuit and the row decoder or the column decoder and the other one of the source and the drain thereof is grounded, and each second switch circuit has a function of grounding a connection point between the row or column decoder and the corresponding one of plurality of first switch circuits when the corresponding one of plurality of first switch circuits is electrically disconnected.

7. A nonvolatile semiconductor memory device according to claim 6, wherein each second switch circuit is formed of an N-channel-type MOS transistor.

* * * * *